US008783545B2

(12) United States Patent
Hesse et al.

(10) Patent No.: US 8,783,545 B2
(45) Date of Patent: Jul. 22, 2014

(54) METHOD FOR QUALITY CONTROL DURING ULTRASONIC

(75) Inventors: Hans-Juergen Hesse, Paderborn (DE); Michael Broekelmann, Delbrueck (DE); Sebastian Hagenkoetter, Paderborn (DE)

(73) Assignee: Hesse GmbH, Paderborn (DE)

( * ) Notice: Subject to any disclaimer, the term of this patent is extended or adjusted under 35 U.S.C. 154(b) by 0 days.

(21) Appl. No.: 12/778,883

(22) Filed: May 12, 2010

(65) Prior Publication Data

US 2010/0280646 A1 Nov. 4, 2010

Related U.S. Application Data

(63) Continuation of application No. PCT/EP2008/065101, filed on Nov. 7, 2008.

(30) Foreign Application Priority Data

Nov. 12, 2007 (DE) .......................... 10 2007 054 626

(51) Int. Cl.
*B23K 20/00* (2006.01)
*B23K 1/06* (2006.01)
*B23K 31/00* (2006.01)

(52) U.S. Cl.
USPC ...................... 228/102; 228/110.1; 228/180.5

(58) Field of Classification Search
USPC ........................... 228/8, 102, 103, 180.5, 904
See application file for complete search history.

(56) References Cited

U.S. PATENT DOCUMENTS

| 3,458,921 A | | 8/1969 | Christensen | |
|---|---|---|---|---|
| 3,794,236 A | | 2/1974 | Salzer et al. | |
| 3,852,999 A | * | 12/1974 | Wright ............................ | 73/588 |
| 4,599,899 A | * | 7/1986 | Jero et al. ........................ | 73/584 |
| 4,606,409 A | | 8/1986 | Peterson et al. | |

(Continued)

FOREIGN PATENT DOCUMENTS

| CN | 1144278 C | 3/2004 |
|---|---|---|
| CN | 101039774 A | 9/2007 |

(Continued)

OTHER PUBLICATIONS

Wang, et al.; "A Neural Network Model for the Wire Bonding Process"; Computers and Operations Research; Oct. 1, 1993; pp. 879-888.

(Continued)

*Primary Examiner* — Kiley Stoner
*Assistant Examiner* — Carlos Gamino
(74) *Attorney, Agent, or Firm* — Patent Central LLC; Stephan A. Pendorf

(57) ABSTRACT

A method for quality control during ultrasonic bonding, in which a transducer bonding tool unit and an ultrasonic generator are used and in which, during the bonding, one or more sensors are used to sense measurement signals for one or more parameters, which can vary during the bonding, for assessing the bond quality and/or for influencing the bonding, and which proposes that, during the bonding, at least one speed profile measurement signal representing the time/speed profile of the tip of the ultrasonic tool in the direction of oscillation thereof be sensed. The invention also relates to a bonding apparatus which is suitable for carrying out the method. Furthermore, the invention relates to other quality control methods for ultrasonic bonding and to bonding apparatuses which are suitable for carrying out these methods.

10 Claims, 8 Drawing Sheets

(56) References Cited

U.S. PATENT DOCUMENTS

| | | | |
|---|---|---|---|
| 4,606,490 A * | 8/1986 | Chan et al. | 228/103 |
| 4,815,001 A * | 3/1989 | Uthe et al. | 700/212 |
| 4,854,494 A * | 8/1989 | von Raben | 228/102 |
| 4,998,664 A | 3/1991 | Gibson et al. | |
| 5,213,249 A * | 5/1993 | Long et al. | 228/102 |
| 5,431,321 A | 7/1995 | Link et al. | |
| 6,308,881 B1 * | 10/2001 | Hesse et al. | 228/102 |
| 6,439,447 B1 | 8/2002 | Minamitani et al. | |
| 6,929,168 B2 * | 8/2005 | Mayer et al. | 228/103 |
| 7,611,039 B2 * | 11/2009 | Hesse et al. | 228/1.1 |
| 7,669,749 B2 * | 3/2010 | Frank et al. | 228/102 |
| 8,021,504 B2 * | 9/2011 | Gabler et al. | 156/64 |
| 2007/0152021 A1 | 7/2007 | Hesse et al. | |

FOREIGN PATENT DOCUMENTS

| | | |
|---|---|---|
| DE | 3429776 A1 | 2/1986 |
| EP | 0247291 A2 | 12/1987 |
| EP | 0275877 A2 | 7/1988 |
| EP | 0368533 B1 | 9/1992 |
| EP | 0540189 B1 | 5/1993 |
| EP | 1342201 A2 | 9/2003 |
| EP | 1023139 B1 | 10/2004 |
| EP | 1789226 A1 | 5/2007 |
| EP | 1897648 A1 | 3/2008 |
| FR | 2302172 A1 | 9/1976 |
| JP | 05206224 A | 8/1993 |
| WO | 9919107 A1 | 4/1999 |
| WO | 0247007 A2 | 6/2002 |
| WO | 02070185 A1 | 9/2002 |
| WO | 2006032316 A1 | 3/2006 |

OTHER PUBLICATIONS

European Search Report; Application No. EP 11 17 6310; Issued: Mar. 20, 2012; Mailing Date: Mar. 30, 2012; 8 pages.

Brokelmann, et al.; "Model Based Development of an Integrated Sensor-Actuator System for Online Quality Monitoring in Ultrasonic Wire Bonding" American Society of Mechanical Engineers; 2005; pp. 219-226.

Dong Zhang, et al.; "Monitoring Wire Bonding via Time-Frequency Analysis of Horn Vibration"; IEEE Transactions on Electronics Packaging Manufacturing; Jul. 1, 2003; pp. 216-220.

M. Mayer and J. Schwizer "Microelectronic Bonding Processes Monitored by Integrated Sensors" in: Sensors Update vol. 11, Baltes, Fedder, Korvink (eds.), Wiley-VCH, Weinheim, Germany, ISBN 3-527-30601-3, 2002; pp. 261-277.

Brokelmann, et al.; "Bond Process Monitoring Via Self-Sensing Piezoelectric Transducers"; Frequency Control Symposium and Exposition; 2004; 5 pages.

International Search Report and Written Opinion of the International Searching Authority; PCT/EP2008/065101; Mar. 16, 2009; 14 pages.

Stürmann; "Process Integrated Quality Control in Wire Bonding—Quality Data in Real-Time"; Productronic; www.productronic.de; Nov. 2007; 6 pages.

* cited by examiner

METHOD FOR QUALITY CONTROL DURING ULTRASONIC

CROSS-REFERENCE TO RELATED APPLICATIONS

The present application is a continuation of pending International patent application PCT/EP2008/065101 filed on Nov. 7, 2008, which designates the United States and claims priority from German patent application number 10 2007 054 626.4 filed on Nov. 12, 2007, the content of which is incorporated herein by reference.

FIELD OF THE INVENTION

The invention relates to methods for the production and quality control of bonded connections, in particular ultrasound wire bonded connections, and to components suitable for carrying out these methods as well as to bonding apparatuses equipped with components of this kind, in particular wire bonders. The invention also relates in particular to wedge-wedge bonding. The overall aim of the invention is improved productivity and improved quality control compared to conventional techniques.

BACKGROUND OF THE INVENTION

Wedge-wedge bonding is a generally recognized and reliable technique for establishing electrical contact between a chip and a substrate. It is used both in power electronics and in microelectronics. To monitor the quality of the bonding process, a specific percentage of the products are taken during the course of production and subjected to a destructive test, and the quality of the overall production batch is assessed using statistical methods.

The desire for further quality control, in particular in areas where safety is an issue, has led to the development in recent years of several methods that allow in-line monitoring to be performed in addition to the destructive test specified above. Broadly speaking, two methods should be mentioned, on the one hand the nondestructive mechanical testing of a bonded connection, in which low forces act on the connection (tensile or shearing forces), in order to test its strength, on the other hand a method based on the measurement of signals that can be obtained directly from the ultrasonic generator or the position sensor of the transducer.

The second method uses the current flowing in the transducer, the voltage at the output of the ultrasonic generator or the deformation of the wire, or a combination of these as measured variables.

The bonding force, the ultrasonic power and the bonding time serve as correcting variables for defining a process window. These methods are described in the U.S. Pat. No. 4,606,490, EP 0 368 533 B1 and EP 0 540 189 B1. An essential feature of these methods is that the variables measured vary with a profile that follows a characteristic curve predetermined by the user. A weakness of this method is that even poor bonded connections may exhibit such deformation and current profiles. Consequently, the set procedure specified is necessary, but in no way sufficient for determining the quality of a bond, and is therefore unsuitable for detecting with certainty a bond of inferior quality.

An attempt to rectify this shortcoming can be found in the patents EP 1 023 139 B1 and EP 1 342 201. In the earlier methods, only one measured variable was considered and taken as a basis as a measure of quality. In recent methods, it is attempted to combine the aforementioned variables and derive quality criteria from them. Here, instead of the current, the electrical admittance of the transducer is used as a variable that is most independent of the ultrasonic power. It is attempted to use the combination of the admittance profile and the deformation of the wire, and the correlation between them, to achieve a more reliable finding as to the quality of a connection.

These methods do not achieve the aim either, since the measured variables used do not correlate sufficiently with the physical processes taking place in the connecting zone. For example, the electrical resonance (phase angle between current and voltage=zero) does not correspond to the mechanical resonance (phase angle between the speed of the tip of the tool and the voltage=zero), so that systems which only use the electrical variables are not operated with mechanical resonance. Neither the speed of the tip of the tool nor the friction between the parts being connected, that is to say the physical variables that are of decisive importance directly for the formation of the connection, are recorded by the aforementioned methods.

The use of a sensor mounted in the membrane is described in the applicant's EP 1 789 226 A1 and WO 2006/032316 A1.

The described methods that have so far become known are therefore not suitable for acquiring the data essential for assessing the quality of a connection and processing them correspondingly. To this extent, these methods cannot satisfy the requirements for quality monitoring in fully automatic bonders. It is therefore desired to provide a method and apparatus for quality control during wire bonding operations that addresses these deficiencies.

SUMMARY OF THE INVENTION

According to a first aspect, the invention is directed to a method for quality control during ultrasonic bonding, in particular ultrasonic wire bonding, in which a transducer/bonding tool unit and an ultrasonic generator are used. During the bonding, measurement signals for one or more parameters that can vary during the bonding are sensed using one or more sensors. These parameters are used for assessing the quality of the bond and/or for influencing the bonding, in particular by means of controlling or regulating the bonding process.

It is a first object of the invention to provide improved quality control, by incorporating further physical variables beyond those used in the prior art that are essential for, or informative about, the formation of a connection.

The speed of the tip of the wedge and the friction between the parts to be connected are physical variables or parameters of the bonding process that are essential for the formation of a connection, and to this extent are informative for the assessment of the bonding operation. Accordingly, the first object of the invention is achieved by extracting these variables or parameters from a sensor signal and making them available to an assessment unit. This assessment unit can then assess the process data by incorporating the variables or parameters and a suitable reference model.

To achieve this object, the invention proposes a method wherein during the bonding, at least one speed profile measurement signal that is representative, in particular qualitatively or with respect to the phase profile, of the time/speed profile of the tip of the ultrasonic tool in the direction of oscillation thereof is sensed. The time/speed profile of the tip of the tool or wedge represents a parameter (bonding parameter) which, as a measured variable or as a variable parameter of the bonding operation, allows observation thereof. The measurement signals generated from it can be used as input variables for a subsequent evaluation, in particular for assessing the quality of a bond, and/or for controlling and/or regulating the bonding operations at the time and/or subsequently. One or more further input signals from various sources may also be included. All variables relevant to the process come into consideration, for example the wire deformation, the frequency from the ultrasound system, the phase difference between current and voltage and the ultrasonic current, and from additional sensors, for example the mechanical ultrasonic oscillation and the phase between wedge speed and ultrasonic current. The parameters or measured variables may be recorded continuously or virtually continuously or at a suitable clock rate. The numerical values determined for a respective measured variable during the production of a bonded connection, i.e. during a bonding operation, may be combined as a column of values to form a vector ("feature vector"), which is available for further evaluation and use. The values recorded in a time interval, and optionally grouped together to form a vector, are also referred to hereafter in their sequence over time as "profiles". The recording resolution of the time/speed profile of the tip of the tool in the direction of oscillation thereof should be in such fine time increments that a time profile generally made up of sine and/or cosine components is thereby reproduced. Recording can be performed in real time for measured variables, preferably using FPGA-based electronics, which can be connected to a DDS ultrasonic generator by means of an additional interface.

Further process-relevant variables may also be derived from one or more of the aforementioned signals determined with respect to measured variables or bonding parameters. In particular, the sensor signals determined from the speed profile of the tip of the tool may be used to obtain derived variables which are associated with or represent the friction between the tip of the tool or wedge and the wire, the friction between the wire and the substrate, the coupling of the wire to the substrate and the deflection or speed of the tip of the tool or wedge. The generation of derived signals from measurement signals may be carried out for example by processing, and/or transformation, of one or more measurement signals (for example by filtering) and/or by computational combination of a number of measurement signals (for example two, three, or more measurement signals.). Mechanical admittance, for example, may also be derived as a quotient of two measured variables, tool speed and generator voltage. Other examples of derived variables are electrical admittance (derived as a quotient of the current and voltage of the generator) as well as electrical impedance (derived as the inverse value of the admittance).

Furthermore, variables based on similarity functions (texture comparisons) represent further possible input variables, and may be used for the calculation of a quality index according to further aspects of the invention. Each of these input variables represents a vector, the length of which is dependent on the recording duration, the sampling rate and optionally applied pre-processing operations.

According to other aspects of the invention, it is preferred that the speed profile measurement signal is recorded by means of a piezo sensor, which is preferably disposed in/on a mounting of the ultrasonic transducer and by means of which it is possible to measure a transverse extension perpendicular to a propagating ultrasonic excitation wave. A piezo sensor, such as that described in the applicant's WO 2006/032316 A1, may preferably be used for this purpose. The content of this document is hereby incorporated in full in the present application, and one or more of the features described therein may be included in claims of the present application.

Surprisingly, investigations with such a sensor have found that the speed of the tip of the tool or wedge, measured with a laser interferometer for purposes of comparison, coincides with the sensor voltage phase angle. Accordingly, objects of the invention are achieved by measuring the time/generator voltage profile fed to the ultrasonic transducer from the ultrasonic generator, by determining the phase difference between the time/generator voltage profile and the speed profile measurement signal, (for example by means of a phase comparator), and by setting or changing the oscillation frequency of the ultrasonic tool by means of the ultrasonic generator in such a way that said phase difference is reduced, preferably to substantially or precisely zero. This produces a state of mechanical resonance, which offers considerable advantages in the production of bonded connections. In this state, there is an optimum transmission behavior of the piezo oscillation to the welding tool and only particularly small losses occur. Accordingly, the invention can approach the state of mechanical resonance in a controlled manner. This was not possible in the past, because there was no possibility of measuring the time/speed profile at the bonding apparatuses, and because a corresponding use for this measurement was also unknown. Instead it was attempted in the past, though only with limited success, to improve the transmission behavior and losses by setting electrical resonance. This involved using a phase comparator to determine the phase difference between the transducer current and the transducer voltage and using a phase regulator for adjustment involving changing the oscillation frequency to zero. However, the state of electrical resonance does not generally coincide with the desired state of mechanical resonance, so that the setting thereof was not possible in a controlled manner. It was then found that, with the tool oscillating, the speed profile is similar to the measurement signal of the piezo sensor up to high spectral components so that the mechanical resonance can be set with high accuracy. A PLL, i.e. phase locked loop or closed loop, known per se, may be used for example for adjusting the phase difference to zero.

As far as the previously explained first aspect is concerned, the invention also includes a bonding apparatus, preferably a wire bonder, for the production and quality control of ultrasonic bonded connections, having a transducer/bonding tool unit and an ultrasonic generator as well as at least one sensor for obtaining measurement signals for at least one parameter that can vary during the bonding. The invention proposes that the bonding apparatus has at least one sensor which is suitable for generating a speed profile measurement signal representing the time/speed profile of the tip of the ultrasonic tool in the direction of oscillation thereof. The invention of course also includes in this connection an ultrasonic generator, which can regulate the phase between the speed of the tip of the wedge and the ultrasonic voltage, so that the system operates in phase zero at its mechanical resonance.

According to the invention, there are various uses for these profiles, depending upon the requirements for influencing the subsequent bonding and/or for assessing bonding results (quality of a bond). The friction value determined in the case of a process state of the bonding operation at a particular time (in the sense explained above as a derived variable) may be used for controlling and/or regulating the bonding operation and/or subsequent bonding operations, preferably in the course of influencing manipulated variables, such as for example the bonding force, ultrasonic power, bonding time and/or ultrasonic frequency.

Alternatively or in combination, a quality value characterizing the quality of a bonding operation or a bonded connection may be determined from the friction value/time profile and a setpoint friction value/time profile that is predetermined or determined and stored beforehand by means of a computer in a learning phase, preferably according to or by analogy with features explained below. For example, the setpoint profile of the derived friction may also be represented as a vector, and its elements may be compared step by step with temporally associated elements of the actual vector. For example, a deviation vector may be formed from the respective differences. Generation of setpoint value profiles of measured variables and/or derived variables in a preceding learning phase, is also referenced in the description below. The quality value may also be used for controlling and/or regulating subsequent bonding operations, preferably in the course of influencing manipulated variables such as the bonding force, ultrasonic power, bonding time and/or ultrasonic frequency. The quality value may also be used for influencing manipulated variables of the bonding process, such as in particular the bonding force, ultrasonic power, bonding time and/or ultrasonic frequency in the course of controlling or regulating and/or for the emission of warning signals when critical values are reached. It has been found that the profiles of the tool speed in the direction of oscillation occurring during individual bonding operations and profiles derived therefrom (in particular the derived friction) can, depending on the bonding conditions, make it possible to provide a more reliable determination of the quality of a bonding operation compared to conventional evaluation parameters (in particular, wire deformation). The method according to the invention therefore makes more precise monitoring of the quality of a bond possible in comparison with the prior art, and if need be (for example if the bonding conditions change), improved influencing of manipulated variables to obtain consistently high quality bonds. In particular, a regime of controlling and/or regulating bonding processes may integrate a setpoint/actual comparison of the derived friction, with the further possibility that additional parameters could also be taken into consideration.

The first aspect of the invention also includes a bonding apparatus, preferably a wire bonder, for the production and quality control of ultrasonic bonded connections, having a transducer/bonding tool unit and an ultrasonic generator as well as at least one sensor for obtaining measurement signals for at least one parameter that can vary during the bonding. The bonding apparatus may have at least one sensor which is suitable for generating a speed profile measurement signal representing the time/speed profile of the tip of the ultrasonic tool in the direction of oscillation thereof. The invention according to this aspect also includes in an ultrasonic generator, which can regulate the phase between the speed of the tip of the wedge and the ultrasonic voltage, such that the phase of the mechanical resonance is zero.

According to the first aspect of the invention, process-integrated quality monitoring modules may also be generated using friction and mechanical admittance (quotient of the speed of the tip of the wedge and the voltage of the generator), preferably with specifically predetermined reference data (setpoint data). In this case there is the possibility of processing external sensor values. The transducer-wedge system may also be operated at its mechanical resonance or optionally at electrical resonance. Derived variables for the friction and the wedge speed can be determined from measured variables.

According to a second aspect, the invention relates to a method for quality control during ultrasonic bonding, in particular ultrasonic wire bonding, in which a transducer/bonding tool unit and an ultrasonic generator are used and in which, during the bonding, measurement signals for one or more parameters that can vary during the bonding are sensed, in particular for assessing the quality of the bond and/or for influencing the bonding.

It is the object of this further aspect of the invention to develop a more accurate and reliable assessment of the quality of a bond than is provided by the prior art.

This object is achieved according to the invention first and foremost in conjunction with the features that, during the time period of bonding operations, measurement signals for one or more parameters, such as in particular the current intensity and/or voltage at the ultrasonic generator or transducer and/or wire deformation and/or ultrasonic frequency or resonant frequency and/or tool speed, are recorded by means of sensors and are respectively provided as, in particular, a temporal actual profile, in particular are kept in a memory, that it is provided in particular that one or more actual profiles for variables derived from the parameter(s) is/are formed from measurement signals for one or more parameters of the bonding process, that one or more actual profiles is/are respectively subjected to a computing operation, in particular a comparing operation, with a setpoint profile which is stored in a memory and is associated with the respective actual profile with respect to the parameter thereof or the derived variable thereof, a deviation profile being determined in each case for the actual profiles, in particular by comparison of individual values of actual and setpoint profiles that are temporally associated with one another and that an individual quality index $Q_i$ and/or a quality index Q collectively characterizing the quality of an individual bonding operation or individual bonded connection is respectively calculated by means of suitable computational means from one or more deviation profiles and, in particular, is stored and/or used for controlling or regulating subsequent bonding processes.

According to aspects of the invention, it is possible to monitor the quality of a bond in a particularly clear and informative way, and to control and/or regulate the process of producing bonded connections, by determining individual quality indices $Q_i$, (also referred to within the scope of the invention as feature extraction (cf. also the figures)), Within the scope of the invention, multi-variable appraisal or multi-variable monitoring is preferred.

The actual profiles, setpoint profiles and deviation profiles may in principle or in general, i.e. also in connection with the other aspects of the invention, again be, for example, one-dimensional vectors or sequences of values, with values preferably sorted in the time sequence of the underlying measurement signals. In this view, it is also possible to refer to these profiles in terms of vectors (feature vectors) instead of profiles, i.e., as actual vectors, setpoint vectors, deviation vectors, etc. In a simplified form, these vectors may be understood as columns of values, the number of their numerical values depending, inter alia, on the clock rates used in the measurements and the duration of the bonding operations or measurements. In this aspect, it is preferred that actual vectors and setpoint vectors have the same dimension or length, so that pairs of values of two vectors that are associated with one another in the sequence of steps or measuring times (i.e. temporally), can be respectively evaluated in a particularly clear way for generating values of the deviation vector.

As described above, the invention proposes generating feature profiles or feature vectors from measured and/or derived variables. The underlying feature vector or the deviation vector thereof is preferably converted into a scalar variable to calculate an individual quality index Q. If the number of feature vectors or profiles on which the quality calculation is based is denoted by n, this is a mapping of n feature vectors that may have the same or different dimensions onto a feature vector (result vector) of the dimension n. Each element of the result vector may in this case preferably correspond as a scalar variable to the value of the respectively underlying feature vector.

It is preferably provided that, in the calculation of the quality index Q, at least some of the deviation profiles are weighted individually, and may be weighted independently of one another, in particular according to information previously stored in a memory. The accuracy of the quality assessment can also be increased by variably weighting one or more deviation profiles temporally or in their variation (i.e. with respect to the various elements of the deviation vector) during the calculation.

The method according to the invention may preferably be performed in such a way that an individual quality index $Q_i$ is respectively determined by means of suitable computational means from individual deviation profiles, in particular with individual weighting temporally or in terms of variation, according to stored information and that the quality index Q is calculated from a number of individual quality indices $Q_i$ according to a stored algorithm.

The invention contemplates that various levels of significance may be attributed to different bonding parameters with respect to one another (or variables derived from them, or the measured time profiles thereof) in assessing the quality of a bond. The invention also contemplates that various levels of significance may be attributed to individual bonding parameters (or variables derived therefrom) within different time intervals of a bonding operation. A model which only takes into consideration individual bonding parameters that are assumed to be significant, but does so over the entire bonding duration, or a model which in principle constantly takes into consideration all technically measured parameters may not be sufficient for an exact quality assessment, depending on conditions of the bonding process and the disturbing influences acting on it. However, the method according to the invention makes it possible to integrate findings as to which bonding parameters may have a greater or lesser significance in which time periods during bonding into an automated method for quality control, or into a bonding apparatus suitable for carrying out the method. Such findings and relationships may be determined in tests and then archived, for example in a database, an expert system or the like. If bonded connections are then later produced under corresponding bonding conditions, i.e. for the same reference system, the archived information can be loaded into a main memory, so that a tailored quality assessment is possible. For example, it may be advantageous under certain preconditions to give the time profile of the wire deformation greater significance toward the end of a bonding operation. Similarly, it would be conceivable, for example, to give a profile representing the varying friction a greater weighting in an early time interval of the bonding phase in comparison with a later time interval. Of course it is also possible to provide certain bonding parameters with the same weighting over the bonding duration. However, the current invention contemplates being able to weight various bonding parameters individually, and independently of one another. By analogy, bonding parameters may also be weighted individually, and used within a regime of controlling or regulating the bonding process in real time for influencing manipulated variables. For example, it would be conceivable to influence the ultrasonic power at the beginning of a bonding operation giving greater weight to a first bonding parameter, while giving greater weight to a setpoint/actual comparison for another bonding parameter toward the end of the bonding operation.

Deviation profiles of individual bonding parameters may also be considered at only certain time intervals within bonding operations as a result of their individual weighting. This can be achieved, for example, by assigning these parameters the weighting of zero in other time intervals of the bonding operation. While bonding parameters that are always taken into consideration may be constantly recorded during the bonding duration, individual bonding parameters may be weighted differently during different time intervals in the quality assessment. Apart from predetermining the different weightings themselves, the starting points and ending points for the various parameters may also be predetermined. While the weighting of parameters may change abruptly, it is also possible to predetermine weighting functions in which the weighting factor changes in small steps or virtually continuously. This would be possible, for example, by predetermining weighting vectors.

As discussed above, it is possible to form derived variables from the measurement signals of various parameters using suitable computational means, and in turn to determine deviation profiles from the respective actual profiles thereof, by computational comparison with previously stored setpoint profiles of these derived variables. These deviation profiles may be used to determine a quality index that is weighted individually in terms of time. As above, the term comparison should be broadly understood here in the sense of various possibilities of data processing and computational operations. In a simple example, the comparison could comprise a simple subtraction or formation of the difference between pairs of setpoint values and actual values, but other algorithms would also be conceivable. Setpoint profiles predetermined for example by vectors may be specifically predetermined in a memory (for example originating from an expert system) or may be determined in a prior learning phase, preferably according to or by analogy with features described below. Automation of one or more steps of the method described above is preferably aided by a computer programmed with appropriate software. Preferably, the individual quality indices or the overall quality index may be used to refine control and/or regulation of the bonding operation. Manipulated variables may here again preferably be the bonding force, the ultrasonic power and the bonding time.

As far as its second aspect is concerned, the invention also includes, furthermore, a bonding apparatus, preferably a wire bonder, for the production and quality control of ultrasonically bonded connections The measured variables or parameters, such as current, wire deformation, resonant frequency, wedge speed, phase differences between ultrasonic voltage and current and wedge speed and voltage, as well as the variables derived from the sensor signals, for example admittance or impedance and friction, are compared with a predetermined or learned time profile (setpoint profile). A weighted input variable for the subsequent calculation of the quality index is determined from the deviation of the individual measured variables from the associated setpoint curve or setpoint profile. The weighting of the individual values and the time period in which these values are considered can be set.

According to a third aspect, the present invention relates to a method for quality control during ultrasonic bonding, in which a transducer/bonding tool unit and an ultrasonic generator are used and in which, during the bonding, measurement signals for one or more parameters that can vary during the bonding are sensed for assessing the quality of the bond and/or for influencing the bonding.

Measurements with conventional systems have shown, in particular when using relatively thick wires, that the recorded physical variables vary very greatly in dependence on the bonding surfaces, the substrate materials, the stiffness of the construction, the eigenmodes of the system as a whole, the wedges and wires used, etc. The strongly application-dependent fluctuations of the process variables do not permit the use of characteristic curves as reference data that can be used across all applications in the case of thick wire bonders.

Against this background, it is a further object of the invention to provide a method and an apparatus which can generate suitable reference data (setpoint data) for the assessment of the input data under consideration, or in an analogous sense can learn such data, for a wide variety of applications—in spite of different starting preconditions.

This object is achieved according to the invention first and foremost in conjunction with the features that a learning phase is carried out for at least one specific bonding reference system, with predetermination of specific settings of the bonding apparatus, in particular associated with the bonding reference system in a database, the learning phase comprising a specific collective, i.e. specific number, of learning bonding operations, that, during the time period of learning bonding operations, measurement signals for one or more, time-parallel, parameters of the bonding process, such as in particular the current intensity and/or voltage at the ultrasonic generator and/or wire deformation and/or ultrasonic frequency or resonant frequency and/or tool speed in the direction of oscillation, are recorded in each case or separately by means of sensors and are respectively kept in a memory as, in particular, temporal learning profiles, that, for at least one parameter, the distribution of the probability density or the relative probability of the measurement signal values is determined, in particular using a statistical model, from the collective of the learning bonding operations for points in time or measuring steps that are in each case constant or the same but are different or taken into consideration in the learning profiles, and that the maximum value is determined in each case for the respective distributions, that a characteristic expectation curve is formed from the maximum values of the various distributions and that the characteristic expectation curve is stored as a learned setpoint profile of the parameter concerned.

The sensing of measurement signals by means of the sensors may be carried out continuously, virtually continuously or optionally also at a desired lower clock rate. The chosen duration of the learning phase discussed above, is intended to illustrate that setpoint profiles (setpoint vectors) serving as reference profiles are generated in an automated manner during this phase by means of the bonding method or the bonding apparatus. Such a learning phase could also be thought of as a generating phase for reference profiles or setpoint profiles.

Assuming that stable processes having process parameters which ensure the production of bonded connections of sufficiently high quality exist for the various starting preconditions, the related statistics for each directly measured variable and for each derived variable can be learned. This learning phase serves to generate reference data which may be used during later automatic operations as a basis for the calculation of quality indices. There is therefore no specifically programmed-in characteristic curve for the various processes, but instead the characteristic curves are generated by the system itself under the aforementioned premise.

The variables previously described can be used as input variables. On the basis of the statistics learned, deviations can be quantitatively assessed and used for a quality calculation.

Individual setpoint profiles may be respectively generated in separate learning phases for different bonding reference systems, i.e. for systems with differing bonding conditions. In a first reference system, this could be, for example, a system with a ceramic substrate, in a second, different reference system, it could be, for example, a connector, in a third reference system, it could be, for example, a chip, and so on. The differentiation between the differing bonding conditions, which can lead to different setpoint profiles, is particularly significant in the case of so-called thick wire bonding, since greater deviations can occur here than in the case of thin wire bonding. Accordingly it is also regarded as advantageous if different reference systems are formed, or related individual setpoints are created, for a specific substrate (e.g. a specific ceramic substrate) in combination with different wire thicknesses. In practice, setpoint profiles may be generated for a specific reference system by recording all measured variables of interest (for a quality assessment in a later automatic operation) in parallel, storing each measured variable in a separate vector. Vectors may also be created for derived variables (derived from the measured variables). This step may then be repeated for a second bonding operation and further bonding operations, perhaps for example repeating this step for one hundred bonding operations (or some other number). If, for example, the measured variable profiles are recorded, at a sampling rate of 50 kHz, and the duration of a bonding operation is 10 msec, this results in five hundred measured values for each measured variable or measured variable profile. Process parameter settings (e.g. for example the bonding force, ultrasonic power and bonding time) for the bonding apparatus should be chosen during the learning phase such that a majority of the bonded connections produced have a good quality bond, and a smaller proportion of the bonded connections are of unsuitable quality. In particular, the proportion of bonded connections having unsuitable quality bonds should be less statistically significant than the proportion of connections having good quality bonds. Such settings may either be preselected by trained personnel on the basis of empirical values or, for example, be taken from a database, an expert system or the like. During the learning phase, the values for all measured variables entered into the setpoint curves or setpoint profiles are recorded time-parallel with one another. Measurement signals may be prepared in various ways by means of signal processing components (for example computing units, analogous transmission elements, etc.).

The learned setpoint profiles can be used later in a method for producing bonded connections (production operation or automatic operation) for the quality control of the ultrasonic connections. For example, when producing bonded connections for a specific bonding reference system, the setpoint profiles created during an earlier learning phase may be provided from a database, for example, and read into a main memory. During the bonding operations, measurement signals for one or more parameters are recorded in each case by means of suitable sensors and respectively kept in a memory as temporal actual profiles. For at least one parameter, deviation profiles are also determined as "error vectors" using the recorded actual profile and the setpoint profile learned in the learning phase. The deviation profiles may be determined as described earlier, for example, by computational comparison of values that are temporally associated with one another from the setpoint and actual vectors.

Further, a confidence interval of a specific magnitude about the distribution maximum may be predetermined for the statistical model, wherein the values at the lower interval boundary and/or upper interval boundary are determined. A lower characteristic boundary curve may be formed from the values of the lower interval boundary and/or an upper characteristic boundary curve may be formed from the values of the upper interval boundary. Actual profiles determined during the production of bonded connections may be computationally compared with the lower and/or upper characteristic boundary curve. If the upper characteristic boundary curve is overshot and/or the lower characteristic boundary curve is undershot, an error signal may be generated, stored in a database, associated with the bonded product by means of an identification for later segregation or repair of said product, and/or a user input may be requested by a process controlling or regulating system.

Alternatives of this kind may also be provided if, for example, the quality index Q calculated for a respective bonding operation (or one or more individual quality indices $Q_i$) over- or undershoot(s) specific limit values. It goes without saying that said deviation profiles can, if need be, be determined for a number of parameters. Setpoint profiles for derived parameters may also be determined in the learning phase from the measurement signals for parameters or from expectation profiles. During the subsequent production of bonded connections, actual profiles for said derived parameters may also be determined from the measurement signals or from actual profiles of measurement signals. Deviation profiles associated with the derived parameters may also be determined from setpoint profiles and actual profiles associated with one another for derived parameters. Said deviation profiles of measured variables and/or derived variables may be used for determining individual quality indices and/or an overall quality index, preferably according to one or more features described with reference to the figures. In the method described above, one or more method steps may be automatically carried out in a computer-aided manner by means of software.

According to the third aspect of the invention, a bonding apparatus is also included, preferably an ultrasonic wire bonding apparatus, for the production and/or quality control of ultrasonic bonded connections, which is formed suitably for carrying out the method according to the invention according to one or more of the features described in this respect above, or is adapted for this purpose. For possible effects and advantages, reference is also made to the description as a whole and the figures.

As discussed above, the invention is concerned with providing a self-learning system, the apparatus and the method being suitable for producing statistics that are dependent on the product and operating conditions as a basis for quality calculation. In theory, the quality calculation may include any desired number of input variables that can be provided as measured variables and/or calculated in real time as derived variables of the measured variables, for example by transformation of the measured variables, wavelet transformation, estimation of the variance, etc. Process-integrated quality monitoring modules may be generated using the input variables described (actual profiles or actual vectors) with reference data (setpoint profiles or setpoint vectors), which have been learned in the corresponding learning phases or automatically generated for the different processes. Quality monitoring modules of this kind may be configured as hardware modules and/or as software modules of a bonding apparatus according to the invention (as also in the case of the other aspects of the invention), it being possible within the scope of various aspects of the invention for modules of this kind also to be the subject of independent patent claims. A constant number of input vectors may also be taken into consideration. Feature vectors may also be generated by correlating different measured variables of identical or different time intervals or by correlating identical measured variables from different time intervals. A variable number of input vectors may also be taken into consideration by feedback from a monitoring unit. Finally, process-integrated quality monitoring modules may be generated by using a set of input data extended by a monitoring unit as well as an adaptive quality calculation. An error vector may be transformed to a scalar quality variable.

As far as its third aspect is concerned, the invention also further includes a bonding apparatus, preferably an ultrasonic wire bonding apparatus, for the production and/or quality control of ultrasonic bonded connections, according to claim 42, which is formed suitably for carrying out the method according to the invention according to one or more of the features described in this respect above, or is adapted for this purpose. For possible effects and advantages, reference is also made to the description as a whole and the figures.

On this basis, it is an object of the invention to develop such a method to facilitate improved feedback of operating states.

This object is achieved according to the invention first and foremost by recording measurement signals for a number of parameters (such as preferably the current intensity and/or voltage at the ultrasonic generator or transducer and/or wire deformation and/or ultrasonic frequency or resonant frequency and/or tool speed), during bonding operations by means of sensors. The measurement signals are respectively provided as temporal actual profiles, preferably stored in a memory. One or more actual profiles for variables derived from the parameter(s) may also be formed from measurement signals for one or more parameters of the bonding process. A deviation profile may be determined for a number of actual profiles by may be subjecting each actual profile to a comparative computing operation with a respective setpoint profile stored in a memory and associated with the respective actual profile for the parameter or the derived variable. Preferably, the deviation profiles are determined by comparison of individual values that are temporally associated with one another, An individual quality index (scalar variable) may be respectively calculated using suitable computational means from deviation profiles. A plurality of individual quality indices, at least of one bonded connection, may be compared as a bond index group with a number of different memory index groups stored in a memory, preferably in an expert system, which differ from one another by the values of the individual quality indices associated with specific parameters or derived variables, using at least one predetermined similarity criterion, and, if at least one similarity criterion is satisfied, are associated with a memory index group.

The determination of said individual quality indices is also referred to as "feature extraction". In a simple example application, an individual quality index can be determined from the values or scalars of the associated deviation vector by forming the value. If a similarity criterion for a memory index group is satisified, a preferably electrical classification signal may be generated automatically, causing information to be output and/or used for controlling or regulating a bonding apparatus. Different data concerning the operating state of a bonding apparatus, preferably concerning different errors states, may be respectively associated with different memory index groups in a memory. The generated classification signal or error classification signal may cause the output of information concerning this operating state or error state.

According to a further aspect of the invention, which may also be of independent importance, the individual quality indices formed during feature extraction (which no longer have any time reference) and/or the quality index and/or classification signals of bonded connections produced during bonding operation may be analyzed for aberrant bonds by means of a monitoring device performing computing operations, with consideration for known relationships and statistics. The group of individual quality indices belonging to a aberrant bond may be stored in a memory as a new memory index group and be combined with data concerning the operating state or error state. Measurement signals from the aberrant bond, preferably actual profiles thereof, may be converted statistically into derived variables by means of computational means. The actual profiles of the derived variables thereby formed may be investigated for significant features, profiles, etc.

As far as its fourth aspect is concerned, the invention also includes, furthermore, a bonding apparatus, preferably an ultrasonic wire bonding apparatus, for the production and quality control of ultrasonically bonded connections, which is suitable for carrying out the method according to the invention, with one or more of the features described above, or is adapted for carrying it out.

According to a further aspect of the invention, which may likewise be of independent importance, signals, particularly electrical signals, may be automatically generated for predetermined deviations between bond index groups and memory index groups. The signals may be used, preferably in real time, for controlling or regulating the bonding operations in progress at the time and/or carried out subsequently. To this extent, this is negative feedback in dependence on known memory index groups or error classes. The method described above may also be used after setting and/or maintenance work on a bonding apparatus. The method may be carried out according to one or more of the features described above in an automated manner, preferably in a computer-aided manner using software.

As far as its fourth aspect is concerned, the invention also includes, furthermore, a bonding apparatus, preferably an ultrasonic wire bonding apparatus, for the production and quality control of ultrasonically bonded connections, which is suitable for carrying out the method according to the invention, with one or more of the features described above, or is adapted for carrying it out.

The invention described above makes it possible to classify potential errors during bonding processes, to automatically allocate them to error classes and to name bonding errors in an automated manner. To this extent, the invention may include generating correction variables in real time in dependence on input textures in the feature extraction and providing feedback to the process controlling system. The invention may also include generating correction variables in the quality calculation in the form of a trend analysis and providing feedback to the process controlling system. A further possible application is monitoring user interventions and checking over maintenance work. The invention also makes it possible to transform an error vector to a scalar quality variable.

As far as the various aspects described are concerned, the invention also independently includes those components or modules for the bonding apparatuses that are suitable or satisfactory for carrying out the individual methods according to the invention. To this extent, corresponding components or modules may also be the subject of independent patent claims.

BRIEF DESCRIPTION OF THE DRAWINGS

The aspects of the present invention are described in more detail below with reference to the accompanying figures, in which preferred exemplary embodiments of the method according to the invention and apparatuses according to the invention are represented and in which.

DETAILED DESCRIPTION OF THE INVENTION

Figure 1:
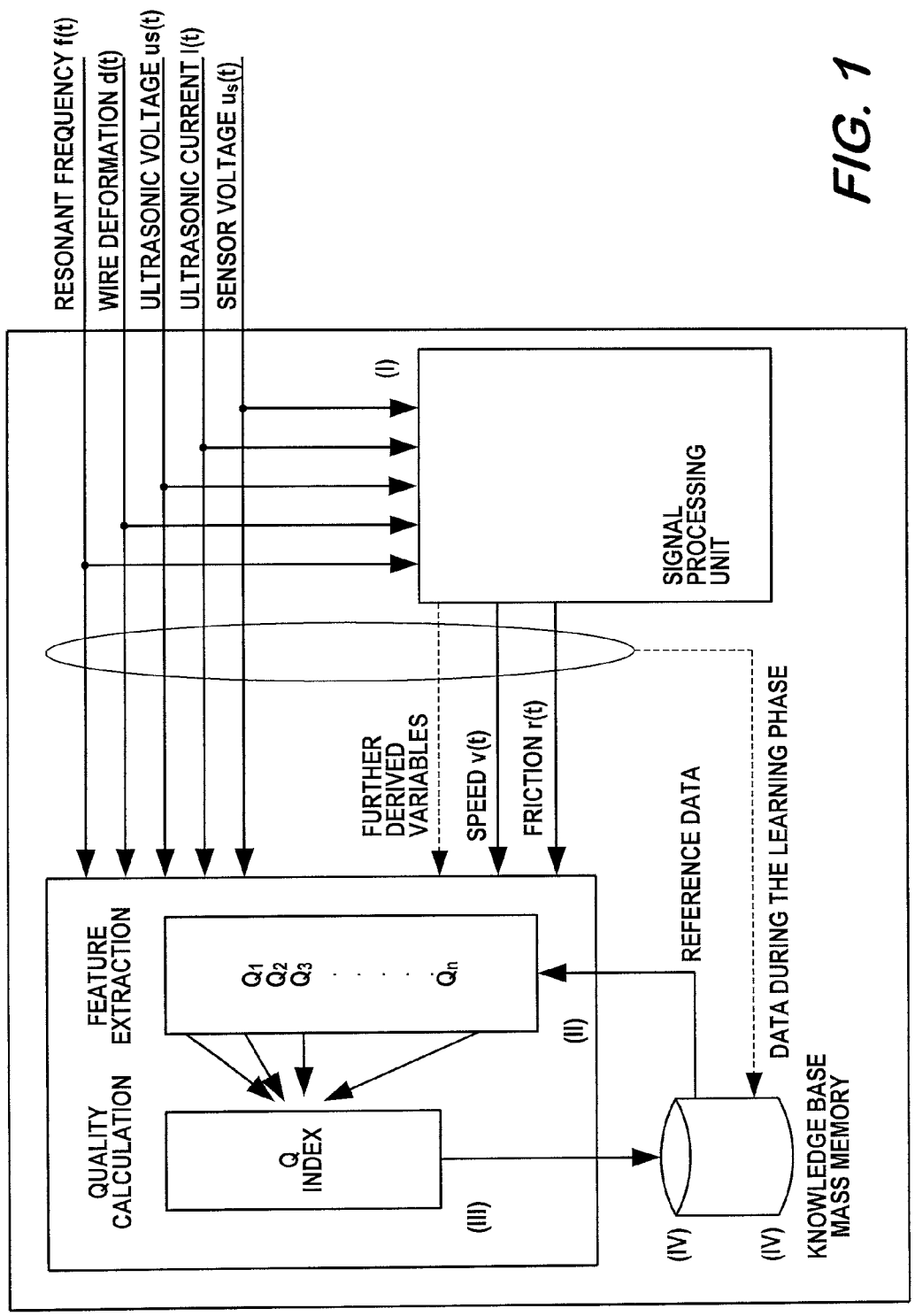
FIG. 1 is a block diagram of an apparatus for determining individual quality indices and a quality index according to the invention.

FIG. 1 shows a preferred arrangement of components suitable for calculating quality indices Q, $Q_i$ (i.e. $Q_1$ to $Q_n$) as described above in the summary of the invention or further herein. Derived variables, including wedge speed and friction, are determined from the raw sensor data (measured variables) with the aid of a special signal processing unit (I). An individual quality value $Q_i$ is calculated for each of the measured variables (e.g. wire deformation, ultrasonic voltage, ultrasonic current, sensor voltage, and resonant frequency determined in real time) in an assessment unit (II) as part of the so-called "feature extraction". These individual quality indices $Q_i$ are then transferred to a calculating unit (III) to calculate an overall quality index Q, $Q_{ges}$ of the respective bonded connection from the weighted individual indices $Q_i$. This quality index is then stored in a memory (IV).

Manipulated variables, as discussed in the summary of invention, may be influenced for controlling and/or regulating the bonding operation or subsequent bonding operations, and may include, for example, the bonding force, the ultrasonic power, the bonding time and/or the ultrasonic frequency. The individual quality indices $Q_1 \ldots Q_n$ may be treated as a vector from which the overall quality index Q can be calculated. Each element $Q_i$ (i.e. $Q_1 \ldots Q_n$) represents a scalar variable which has been respectively calculated from a deviation profile or deviation vector (not shown) of a measured variable or a derived variable in a manner described above in the summary of the invention or further herein. For example the scalar variable may be a vector amount, in particular weighted with respect to its individual elements.

Figure 2:
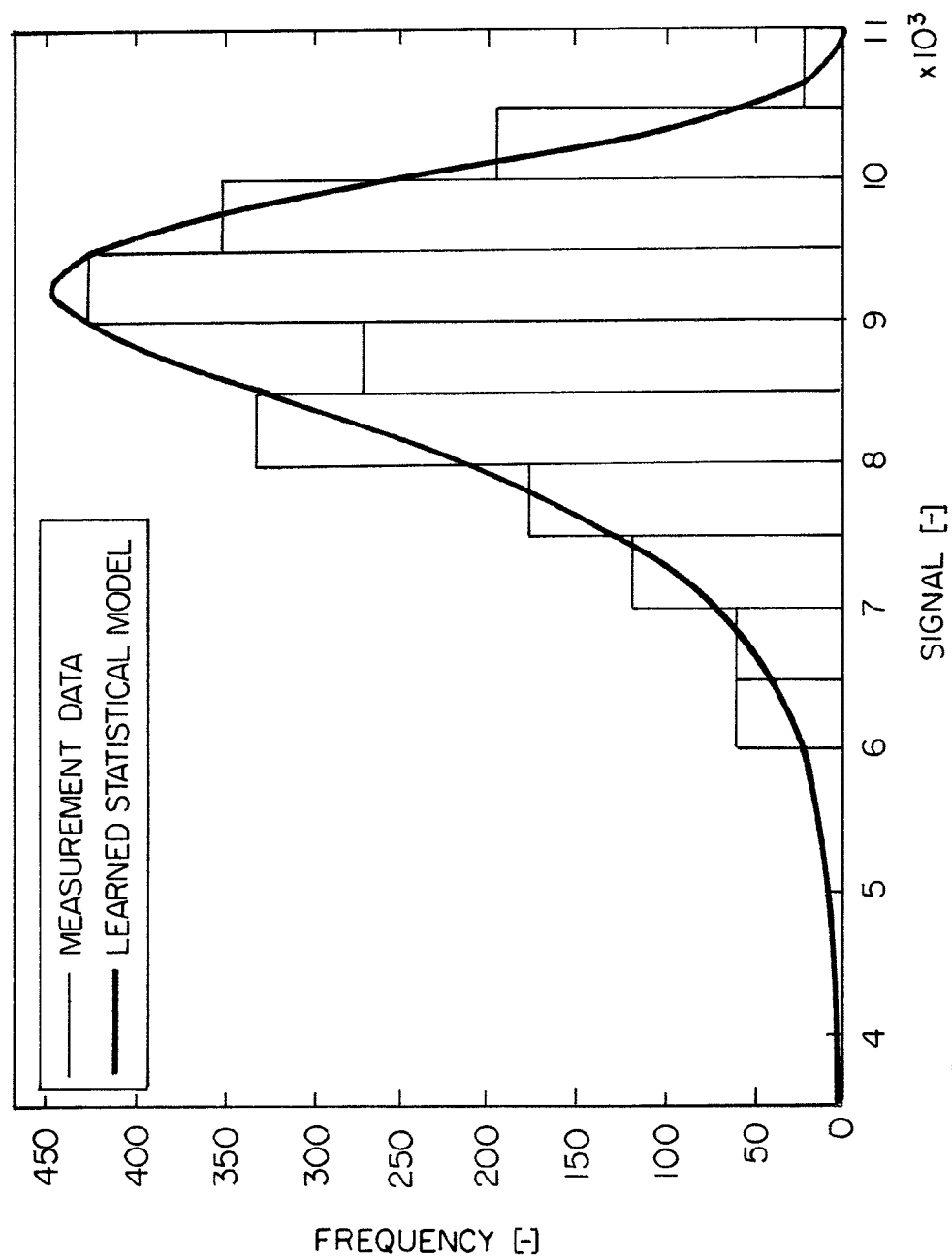
FIG. 2 is a diagram representing a learned statistical model of a parameter or a derived variable.
Figure 3:
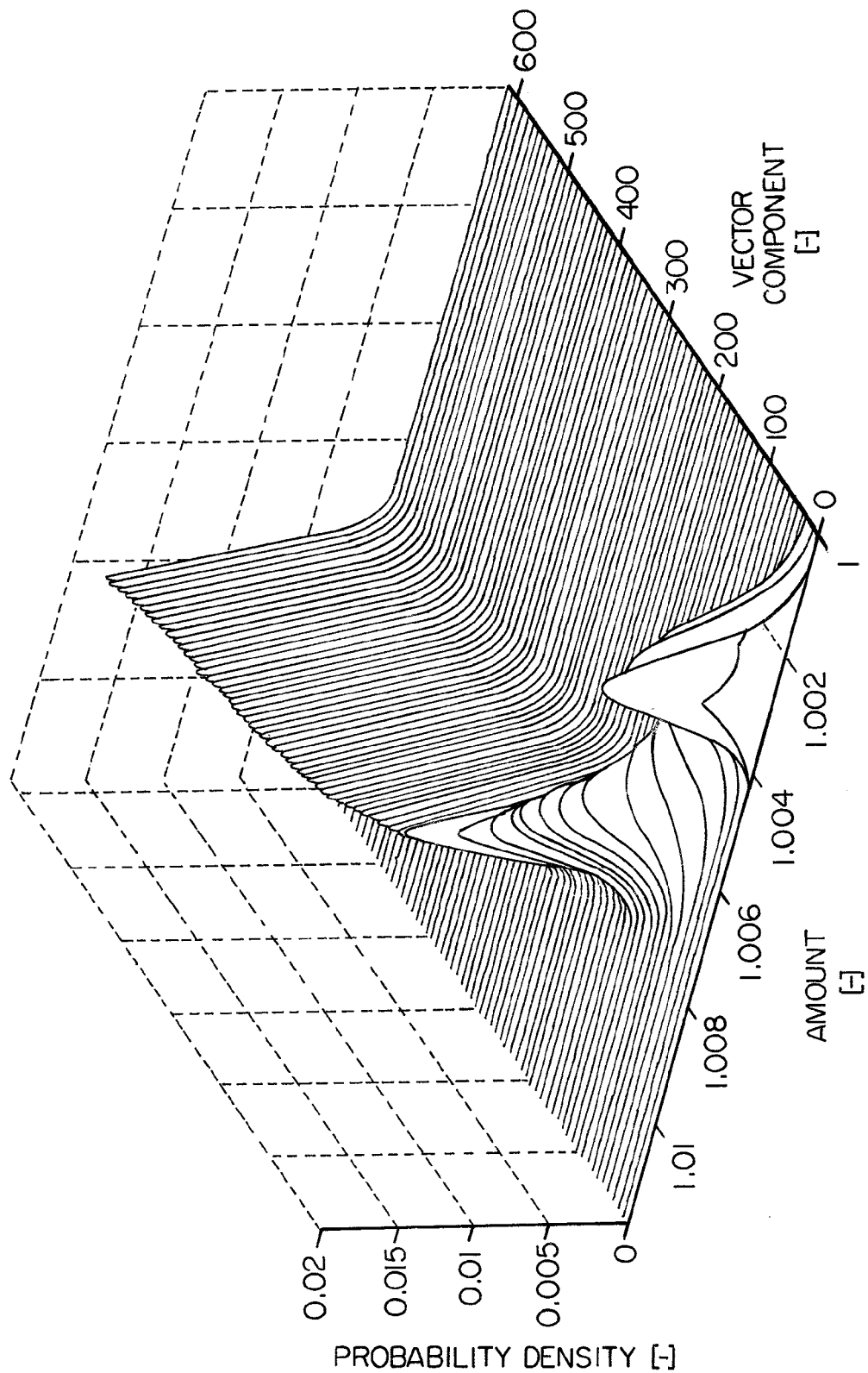
FIG. 3 is a three-dimensional diagram representing the probability density of a measured variable for the sampling times.
Figure 4:
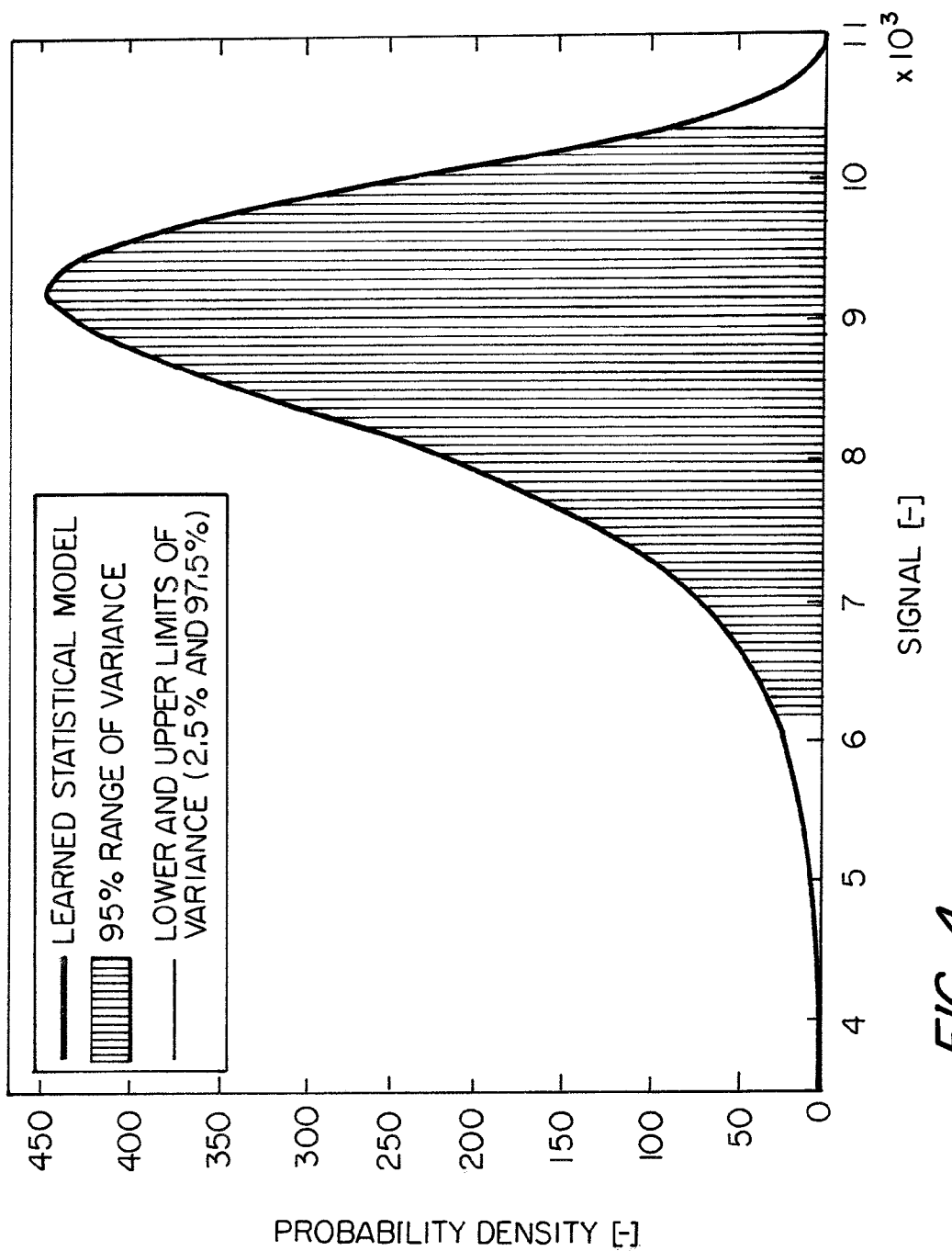
FIG. 4 illustrates a chosen confidence interval of 95 percent based upon the curve profile illustrated in FIG. 2.

A model of the formation of a connection that can be used to assess the quality of the connection can be generated by measuring data which, according to one aspect of the invention, is recorded during a learning phase. FIGS. 2 to 4 illustrate a preferred basic procedure, for generating statistics applicable to a measured variable. FIG. 2 illustrates a representation of an example probability distribution of a measured variable at a specific sampling time.

If all measured variables are recorded and the relative frequency of their amplitudes is considered, a two-dimensional probability density function over the number of individual vector components is obtained. FIG. 3 illustrates an example of such a probability distribution. From this representation, setpoint profiles for the respective measured variables are generated by assuming mean values of the individual vector components for the respective components of the setpoint vector or the setpoint profile. If the respective mean values are plotted in a system of coordinates over a time axis at the respective sampling times and the points are joined by a line (Bézier, spline or the like), a characteristic curve for the measured variable is obtained, i.e. a setpoint vector or setpoint profile is generated (i.e. "learned"). These numerical sequences may also be interpreted as a time vector, the components of which are associated with precisely one sampling time.

However, it is also possible to use input vectors whose components are associated with specific values of other measured variables, such that not every vector contains components which can be assigned to equidistant sampling times. The lengths of the feature vectors may also differ, since their effect on the system may be of importance for over different ranges of the reference variables.

The statistical models may be chosen depending on the input variable. The minimum number of reference bonds for representative statistics depends on the model chosen. In principle, the aim should be to obtain a random sample that is as large and representative as possible. The minimum size is specifically predetermined by the system as a constant. The size of the range of variance or of the confidence interval (FIG. 4) is a parameter that can be set, for example a 95% range of variance; the position of the range of variance or of the confidence interval (FIG. 4) about the respective center point of the random sample is obtained from the learned probability density function and consequently depends on the chosen model and on the reference data.

The quality calculation is preferably divided into two stages, namely the "feature extraction" or determination of the individual quality indices $Q_i$ (FIG. 1, Block (II)) and the quality calculation of the quality index Q (FIG. 1, Block (III)).

Firstly, an expectation value (statistical maximum value) for a respective sampling time is calculated from the two-dimensional probability density function for each variable (parameter of the bonding process or derived variable). The difference between the measured value and the sample reference value (mean value, median, centroid, etc.) is determined for all input variables (components of the input vectors). These feature vectors are preferably normalized component by component to the limits of the confidence intervals. Known statistical methods can be used for this evaluation. In the calculation of the quality indices, different statistics are used for the respective measured variables which are the best-possible fit for the underlying model. A weighting of the individual values and the time period in which these values are considered can be set. For example, the deformation profile of the wire may be of no significance at the beginning of the bonding process or, under some circumstances, no ultrasonically induced deformation can take place in this phase. It may therefore remain unobserved for the first milliseconds of the process. Other physical effects may be of great significance particularly at the beginning of the welding process, such as for example the temporal profile of the friction between the parts being connected. Finally, the vectors containing the $Q_i$'s are subjected to still further transformations, in order to obtain derived variables corrected of disturbing influences. In this way, further feature vectors are produced.

In a next step, the n feature vectors at the input of the feature extraction are mapped onto n scalars at the output. These may once again be regarded as a vector with n components and serve as an input variable for the quality calculation. In the quality calculation, this vector is mapped onto a scalar by a procedure established according to the significance of the components. This scalar is the quality value "Q". A threshold value of Q, which, depending on the configuration, may necessitate intervention by an operator, can be set as a parameter.

Figure 5:
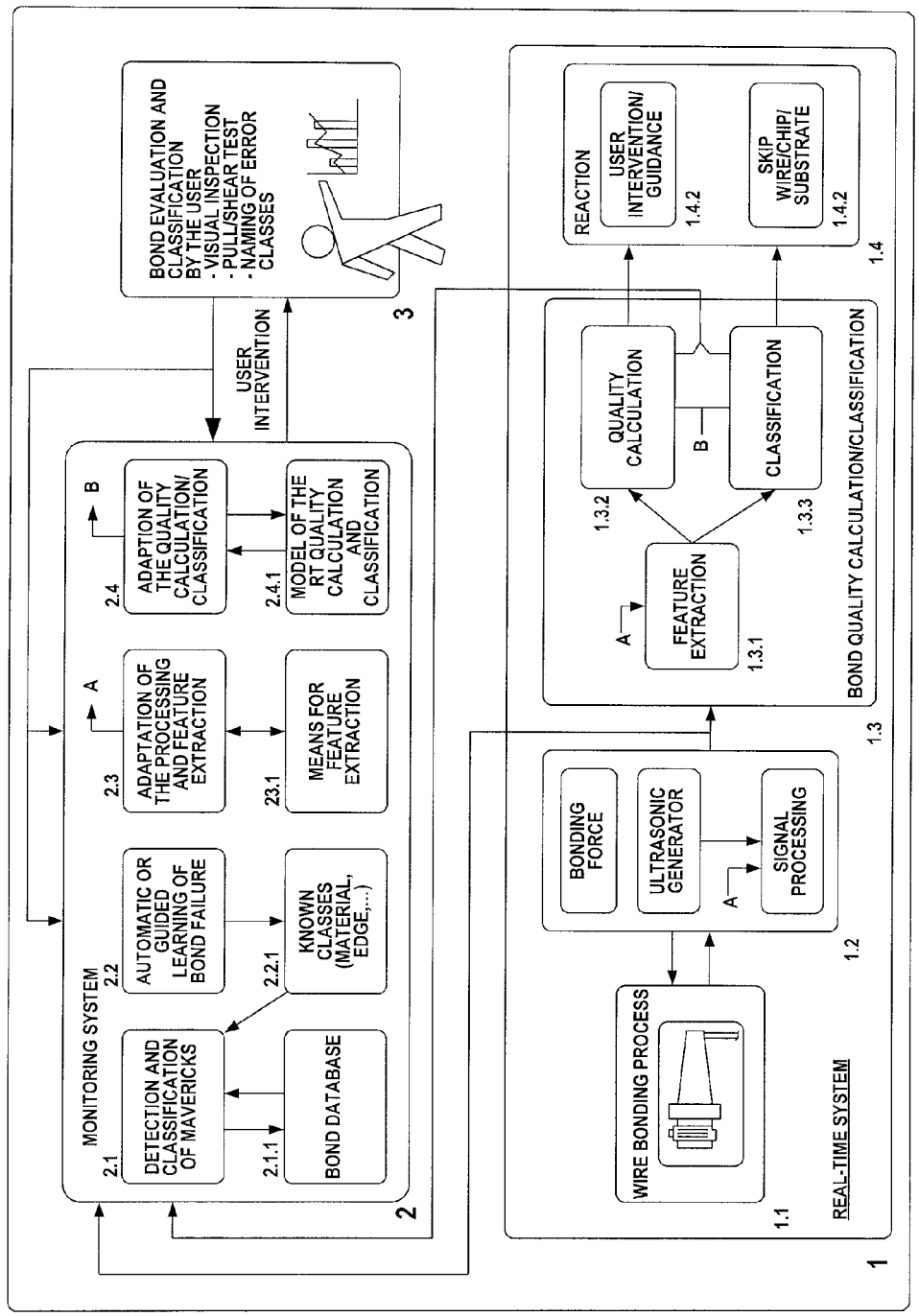
FIG. 5 is a block diagram illustrating an apparatus and a method according to the invention for the classification of bonding errors.

Optionally, feature vectors (Q1 . . . Qn) or error vectors may be categorized with regard to their associated error in a further step. FIG. 5 shows the preferred basic construction of a system suitable for this. The calculation of the quality values takes place in principle as described in the second embodiment. A further module, which allocates the result to a result class, and to this extent can specify causes of errors, is provided (cf. FIG. 5, Block 1.3.3).

The raw data from the signal preprocessing and the ultrasonic generator are not only used for feature extraction (FIG. 5, 1.3.1), but are likewise passed on to a monitoring unit not operating in real time. The monitoring unit likewise receives the result of the quality calculation and of the error classifier (FIGS. 5, 1.3.2 and 1.3.3). The feature extraction, the quality calculation and the error classification each have a further input, through which the results of the monitoring unit are fed back into the calculation of the quality values.

The monitoring system processes the aforementioned values taking account of the statistics known at the time. It is activated, for example, when the substrate is changed or after a previously established number of bonded connections have been carried out and first investigates the entered data for aberrants (FIG. 5, 2.1, (aberrant detection, classification). If aberrants are found, they are transferred to Block 2.2 (automatic or user guided learning of bond failure) and the user is informed. After investigation of the failed bonded connection the system may be notified, e.g. by a user, of a corresponding error name or, on the basis of the investigation result, releasing a new feature as a quality feature. If no user input takes place, the monitoring system automatically classifies the aberrant and assigns an automatically generated ID code without mnemonic reference. This new data vector is transferred to Block 2.3 of the monitoring unit, where it is made into a new feature vector. From there, feedback is provided to the real-time system (FIG. 5, Block 1.3.1, Path A) and the number of input vectors for the feature extraction is increased by one (Block 1.3.1, FIG. 5). In the form described here, this new input vector corresponds to a combination of the raw data coming from outside and transformation of the data through the signal processing unit, also see FIG. 5, Block 1.2.

The dimension of the input vector for the quality calculation/error classification is consequently likewise increased by one. The new feature vector is transferred from Block 2.3 to Block 2.4 (adaptation of the quality calculation and classification). Here, the model is checked for consistency on the basis of the new data, optionally adapted and returned to the quality calculation and the error classifier (FIG. 5, Block 1.3.2 and 1.3.3, Path B). In this way the monitoring system ensures that the quality monitoring is constantly extended or checked over and best-possible model forming is achieved.

Figure 6:
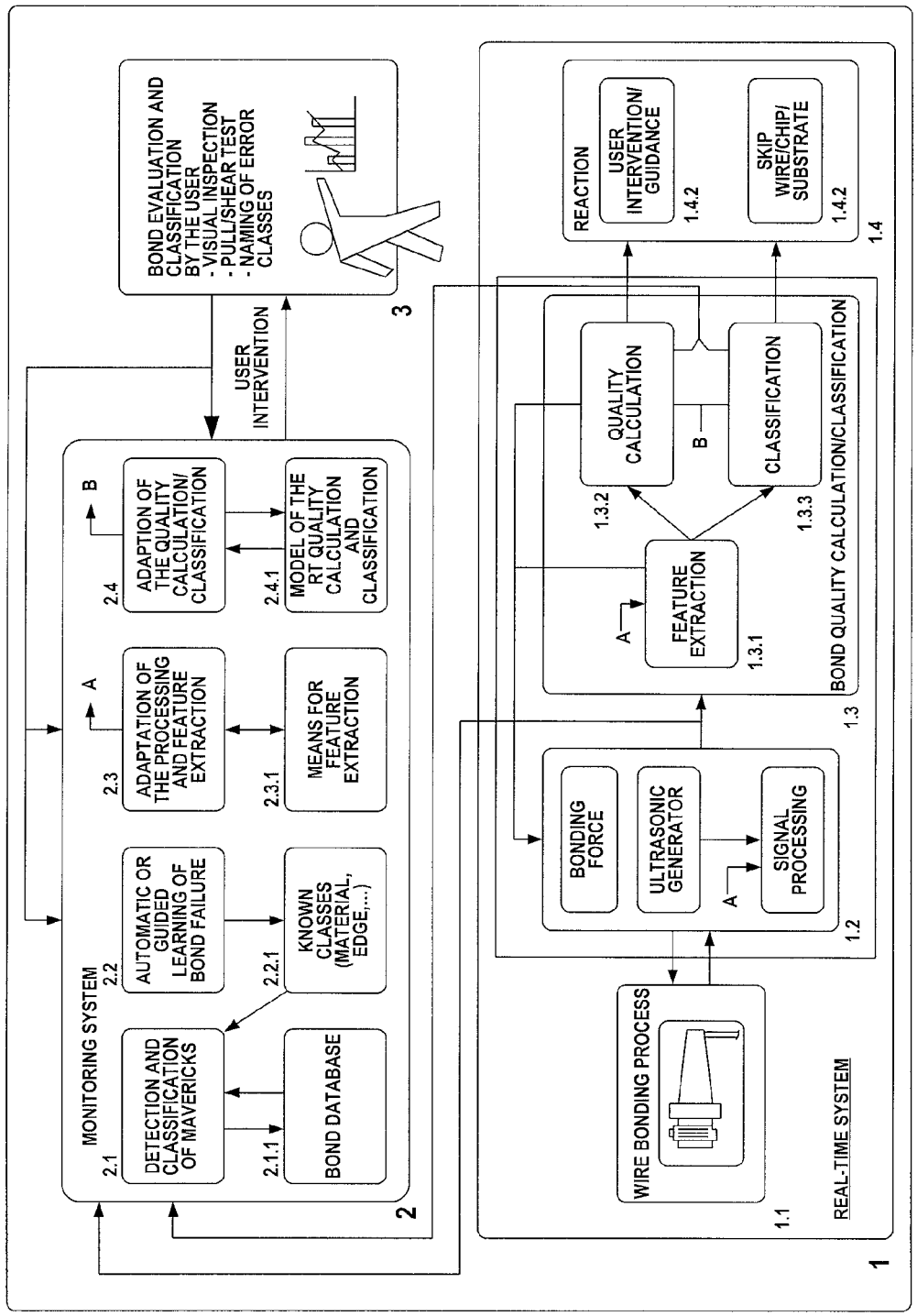
FIG. 6 illustrates the apparatus and method for the classification of bonding errors shown in FIG. 5 incorporating feedback from the classification unit to the process controlling or regulating system.

According to a further aspect of the invention using the quality calculation and the underlying model, a deviation from the model can be detected in real time during the calculation of the vector components of the individual measured variables. The vector components are generally a function of time, and the process can be influenced by suitable parameter adaptation at the time of running the process (see also FIG. 6, negative feedback from 1.3.1 and 1.3.2 to 1.2). Although a system provided with negative feedback is also described by EP 1 023 139, there it is based merely on a specifically predetermined model in the form of characteristic curves. The determination of error classes and the negative feedback in dependence on these error classes is not disclosed. The present invention provides a completely novel solution, which also permits error-related negative feedback to the variables influencing the welding process.

According to a further aspect of the invention, which may also be of independent significance, the method steps and features of a bonding apparatus described above can also be used for checking user interventions. On the basis of exact knowledge of a transducer-wedge system, it is also possible, for example, to check whether, for example, the transducer has been correctly fitted after maintenance work and whether the wedge has been properly installed and fixed with the correct pre-tensioning of the wedge screw. The state of the clamping and the bond holding can also be checked for correct functioning on the basis of the learned textures or profiles.

Figure 7:
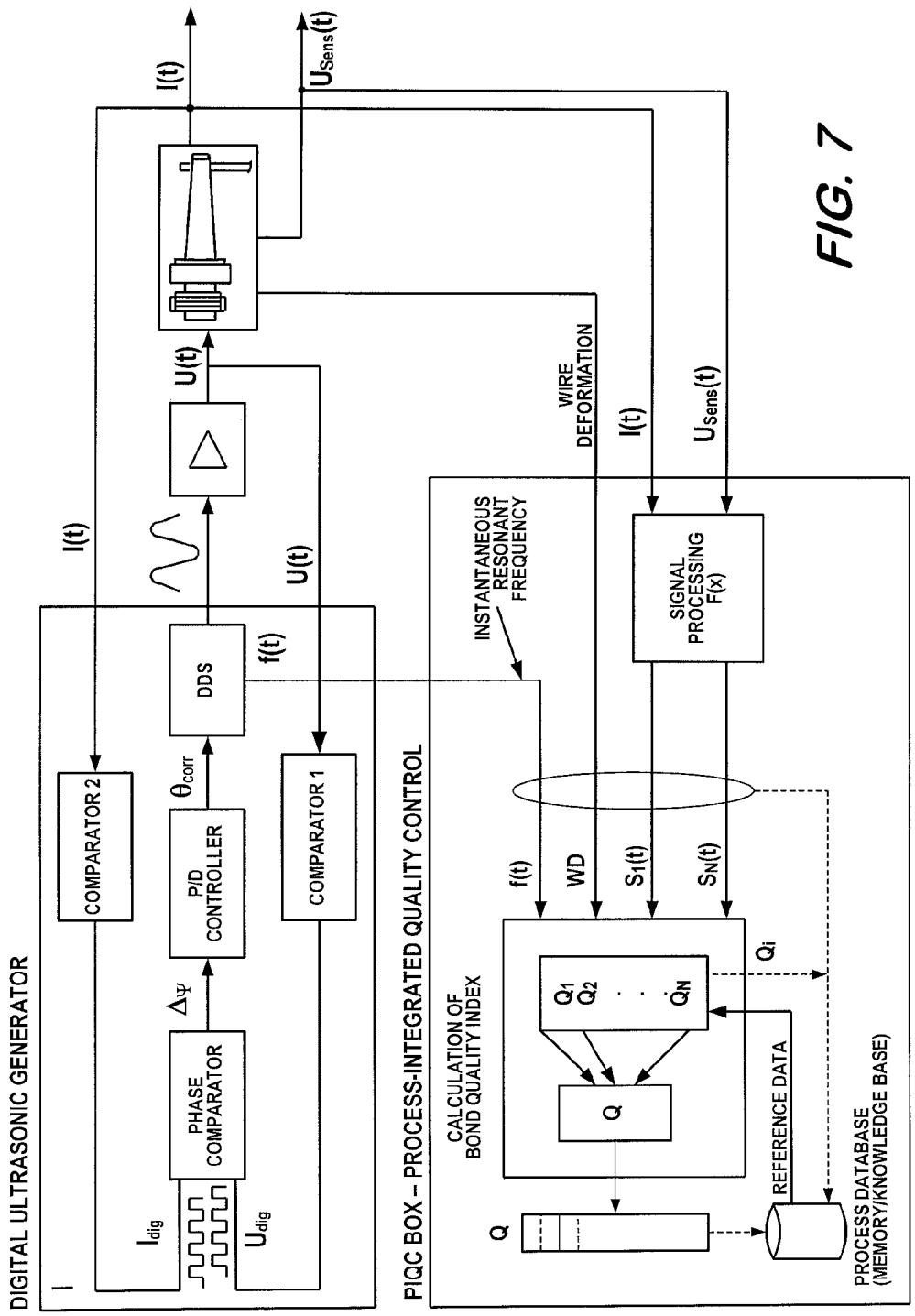
FIG. 7 is a block diagram illustrating a bonding apparatus and a bonding method incorporating an ultrasonic generator for setting electrical resonance.
Figure 8:
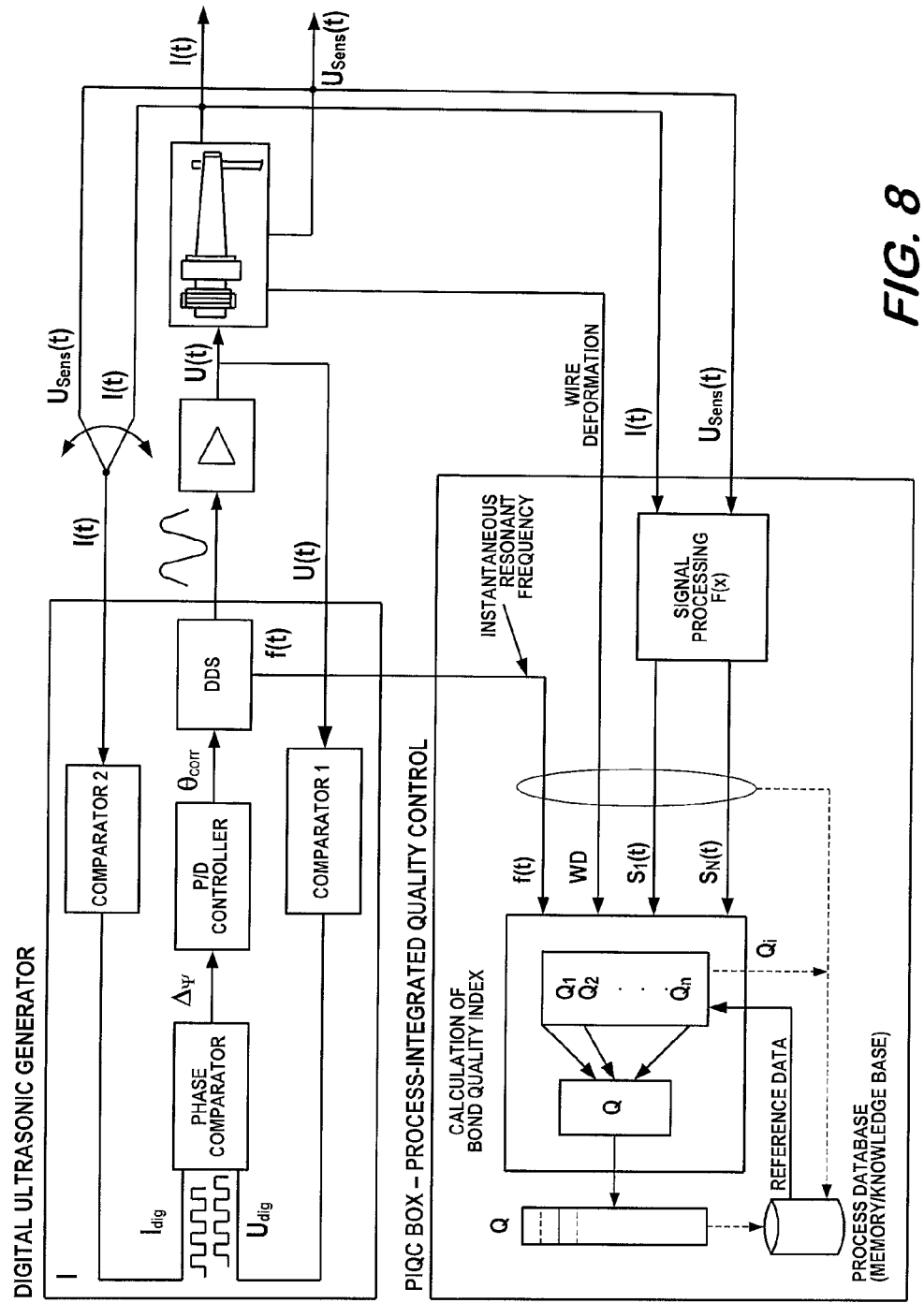
FIG. 8 is a block diagram illustrating a bonding apparatus and a bonding method incorporating an ultrasonic generator for setting mechanical resonance according to the invention.

In Block 1 of FIGS. 7 and 8, essential components of an ultrasonic generator according to a first embodiment are represented, suitable for setting electrical resonance. The comparators 1 and 2 respectively convert the sinusoidal signals for current and voltage into square-wave signals, the zero crossing of which in each case coincides with the zero crossings of the sinusoidal oscillations. Then the phase comparator is used to determine the phase difference between the current and the voltage of the ultrasonic signal. The actual phase value determined in this way is fed to the downstream phase regulator (PID controller) as an input variable. The setpoint phase value for resonance is zero. The output variable of the regulator is the input variable of the DDS (Direct Digital Synthesizer), this variable $\theta_{corr}$ is the phase increment on the basis of which the frequency of the output signal of the DDS is set. This signal is then amplified by means of a power amplifier and fed to the ultrasonic transducer. The regulator changes its variable $\theta_{corr}$ at the output in such a way that the resultant frequency of the DDS at the load (transducer-wedge system) produces the phase difference of zero between the ultrasonic voltage and the ultrasonic current. Such an arrangement is suitable for the setting of electrical resonance.

In FIG. 8, which shows an embodiment that is modified with respect to FIG. 7 and preferred, it is possible to choose whether the current or an alternative sensor signal is passed via the comparator for phase comparison. Disregarding a phase offset, the alternative sensor signal is a measure of the wedge speed, and to this extent can be used for setting the mechanical resonance.

All features disclosed are (in themselves) pertinent to the invention. Individual aspects of the invention that are described, in particular including individual features thereof, may also be combined with one or more of the other aspects of the invention that are described, in particular including with individual features thereof. The disclosure content of the associated/accompanying priority documents (copy of the prior patent application) is also hereby incorporated in full in the disclosure of the application, including for the purpose of incorporating features of these documents in claims of the present application.

What is claimed is:

1. A method for quality control during ultrasonic bonding by assessing the quality of a bond and/or by influencing bonding, which comprises
    providing a transducer and a bonding tool;
    providing an ultrasonic generator connected to the transducer and the bonding tool;
    conducting bonding operations using the transducer and the bonding tool;
    recording measurement signals for at least one parameter using sensors, wherein the at least one parameter can vary during the bonding operations;
    recording learning data for the at least one parameter, the learning data comprising the measurement signals recorded during a number of the bonding operations which comprise a learning phase;
    storing the learning data in a memory as at least one learning profile;
    determining a probability density function from the at least one learning profile;
    determining a maximum value of the probability density function;
    generating a characteristic expectation curve using the maximum value; and
    storing the characteristic expectation curve as a learned setpoint profile for the associated parameter, further comprising
    providing the each learned setpoint profile to a bonding reference system;
    storing the each measurement signals in the memory or another memory as an actual profile for the associated parameter;
    determining a deviation profile for the at least one parameter using the actual profile for that parameter and the learned setpoint profile for that parameter, and
    controlling and/or regulating bonding operations in progress or subsequently carried out using the at least one deviation profile to thereby control the quality of the ultrasonic bonding.

2. The method of claim 1, wherein the probability density function is determined using a statistical model.

3. The method of claim 1 further comprising deriving at least one further deviation profile, and weighting one or more of the deviation profiles independently of one another and/or partwise, for dedicated time intervals.

4. A method for quality control during ultrasonic bonding by assessing the quality of a bond and/or by influencing bonding, which comprises
    providing a transducer and a bonding tool;
    providing an ultrasonic generator connected to the transducer and the bonding tool;
    conducting bonding operations using the transducer and the bonding tool;
    recording measurement signals for at least one parameter using sensors, wherein the at least one parameter can vary during the bonding operations;
    storing the measurement signals in a memory as an actual profile for the associated parameter;
    recording learning data for the at least one parameter, the learning data comprising the measurement signals recorded during a number of the bonding operations which comprise a learning phase;
    storing the learning data in a memory as at least one learning profile;
    determining a probability density function from the at least one learning profile;
    determining a maximum value of the probability density function;
    generating a characteristic expectation curve using the maximum value;
    storing the characteristic expectation curve as a learned setpoint profile for the associated parameter; and
    using the stored expectation curve to control the quality of the ultrasonic bonding, further comprising
    predetermining a confidence interval of a specific magnitude about the maximum value;

determining a lower interval boundary value and/or an upper interval boundary value of the probability density function using the confidence interval;

generating a lower characteristic boundary curve using the values of the lower interval boundary and/or generating an upper characteristic boundary curve using the values of the upper interval boundary; and comparing the actual profile with the lower characteristic boundary curve and/or the upper characteristic boundary curve.

5. The method of claim 4 wherein the measurement signals are electrical signals.

6. A method for quality control during ultrasonic bonding by assessing the quality of a bond and/or by influencing bonding, which comprises providing a transducer and a bonding tool;

providing an ultrasonic generator connected to the transducer and the bonding tool;

conducting bonding operations using the transducer and the bonding tool;

recording measurement signals for at least one parameter using sensors, wherein the at least one parameter can vary during the bonding operations;

recording learning data for the at least one parameter, the learning data comprising the measurement signals recorded during a number of the bonding operations which comprise a learning phase;

storing the learning data in a memory as at least one learning profile;

determining a probability density function from the at least one learning profile;

determining a maximum value of the probability density function;

generating a characteristic expectation curve using the maximum value;

storing the characteristic expectation curve as a learned setpoint profile for the associated parameter; and using the stored expectation curve to control the quality of the ultrasonic bonding, further comprising determining at least one setpoint profile for at least one derived parameter (a) from the measurement signals recorded during the learning phase or (b) from the learned setpoint profile for the parameter;

determining at least one actual profile for the at least one derived parameter from the measurement signals recorded during bonding operations or from actual profiles of the measurement signals recorded during bonding operations; and, determining at least one deviation profile for the at least one derived parameter using the setpoint profile for the derived parameter and the derived actual profile for the derived parameter.

7. A method for quality control during ultrasonic bonding by assessing the quality of a bond and/or by influencing bonding, which comprises providing a transducer and a bonding tool;

providing an ultrasonic generator connected to the transducer and the bonding tool;

conducting bonding operations using the transducer and the bonding tool;

recording measurement signals for at least one parameter using sensors, wherein the at least one parameter can vary during the bonding operations;

recording learning data for the at least one parameter, the learning data comprising the measurement signals recorded during a number of the bonding operations which comprise a learning phase;

storing the learning data in a memory as at least one learning profile;

determining a probability density function from the at least one learning profile;

determining a maximum value of the probability density function;

generating a characteristic expectation curve using the maximum value; and, storing the characteristic expectation curve as a learned setpoint profile for the associated parameter, further comprising storing the measurement signals in the memory or another memory as at least one actual profile for the at least one parameter;

generating at least one actual profile for derived variables from one or more of the measurement signals;

generating at least one deviation profile for one or more of the actual profiles for (a) the at least one parameter or (b) for the derived variables, by comparing an associated setpoint profile which is stored in the memory or another memory with one of the actual profiles;

calculating an individual quality index and/or overall quality index collectively characterizing the quality of an individual bonding operation or individual bonded connection from the at least one deviation profile; and, controlling and/or regulating subsequent bonding processes using the individual quality index and/or overall quality index.

8. The method of claim 7, wherein one or more individual quality indexes and/or one or more overall quality indexes are calculated using a suitable computational means.

9. A method for quality control during ultrasonic bonding by assessing the quality of a bond and/or by influencing bonding, which comprises providing a bonding apparatus comprising a transducer and a bonding tool;

providing an ultrasonic generator connected to the transducer and the bonding tool;

conducting bonding operations using the transducer and the bonding tool;

recording measurement signals for at least one parameter using sensors, wherein the at least one parameter can vary during the bonding operations;

recording learning data for the at least one parameter, the learning data comprising the measurement signals recorded during a number of the bonding operations which comprise a learning phase;

storing the learning data in a memory as at least one learning profile;

determining a probability density function from the at least one learning profile;

determining a maximum value of the probability density function;

generating a characteristic expectation curve using the maximum value;

storing the characteristic expectation curve as a learned setpoint profile for the associated parameter; and using the stored expectation curve to control the quality of the ultrasonic bonding, wherein the at least one parameter includes one or more of current at the ultrasonic generator, voltage at the ultrasonic generator, current at the transducer, voltage at the transducer, wire deformation, ultrasonic frequency, resonant frequency, and/or tool speed.

10. A method for quality control during ultrasonic bonding by assessing the quality of a bond and/or by influencing bonding, which comprises providing a transducer and a bonding tool;
providing an ultrasonic generator connected to the transducer and the bonding tool;
conducting bonding operations using the transducer and the bonding tool;
recording measurement signals for at least one parameter using sensors, wherein the at least one parameter can vary during the bonding operations;
recording learning data for the at least one parameter, the learning data comprising the measurement signals recorded during a number of the bonding operations which comprise a learning phase;
storing the learning data in a memory as at least one learning profile;
determining a probability density function from the at least one learning profile;
determining a maximum value of the probability density function;
generating a characteristic expectation curve using the maximum value;
storing the characteristic expectation curve as a learned setpoint profile for the associated parameter; and
using the stored expectation curve to control the quality of the ultrasonic bonding,
wherein the learning data is recorded for at least one specific bonding reference system and/or specific setting of the bonding apparatus.

* * * * *

UNITED STATES PATENT AND TRADEMARK OFFICE
CERTIFICATE OF CORRECTION

PATENT NO.        : 8,783,545 B2
APPLICATION NO.   : 12/778883
DATED             : July 22, 2014
INVENTOR(S)       : Hans-Juergen Hesse et al.

Page 1 of 1

It is certified that error appears in the above-identified patent and that said Letters Patent is hereby corrected as shown below:

Title Page, item (54) and in the Specification, Col. 1, lines 1-2, the Title should read:

-- METHOD FOR QUALITY CONTROL DURING ULTRASONIC BONDING --

Signed and Sealed this
Thirtieth Day of September, 2014

Michelle K. Lee
*Deputy Director of the United States Patent and Trademark Office*